(12) United States Patent
Bryan (10) Patent No.: US 6,891,705 B2
(45) Date of Patent: May 10, 2005

(54) SMART SOLID STATE RELAY (75) Inventor: Lyle Stanley Bryan, Winston-Salem, NC (US)

(73) Assignee: Tyco Electronics Corporation, Middletown, PA (US)

( * ) Notice: Subject to any disclaimer, the term of this patent is extended or adjusted under 35 U.S.C. 154(b) by 297 days.

(21) Appl. No.: 10/068,925

(22) Filed: Feb. 8, 2002

(65) Prior Publication Data
US 2003/0151860 A1 Aug. 14, 2003

(51) Int. Cl.⁷ .................................................. H02H 7/22
(52) U.S. Cl. ........................... 361/2; 361/101; 361/115
(58) Field of Search ................................ 361/2, 3, 5, 8, 361/9, 13, 56, 57, 58, 93, 100, 101, 102, 115; 307/98, 99, 100, 112, 113, 116, 132

(56) References Cited

U.S. PATENT DOCUMENTS

| | | | |
|---|---|---|---|
| 3,614,464 A | * 10/1971 | Chumakov | ...................... 361/8 |
| 4,438,472 A |   3/1984 | Woodworth | |
| 4,628,392 A | * 12/1986 | Didier | ........................... 361/2 |
| 4,631,621 A | * 12/1986 | Howell | ........................ 361/13 |
| 4,700,256 A |  10/1987 | Howell | |
| 4,959,746 A | *  9/1990 | Hongel | ........................ 361/13 |
| 4,992,904 A |   2/1991 | Spencer et al. | |
| 5,164,872 A | * 11/1992 | Howell | ........................... 361/3 |
| 5,463,252 A |  10/1995 | Jones et al. | |
| 5,536,980 A |   7/1996 | Kawate et al. | |
| 5,633,540 A | *  5/1997 | Moan | ........................ 307/126 |
| 5,703,743 A |  12/1997 | Lee | |
| 5,926,354 A |   7/1999 | King | |
| 5,933,304 A | *  8/1999 | Irissou | ........................... 361/8 |

FOREIGN PATENT DOCUMENTS

| | | | |
|---|---|---|---|
| JP | 62-223931 | 10/1987 | .......... H01H/51/06 |
| JP | 2002-184290 | 6/2002 | .......... H01H/50/30 |

OTHER PUBLICATIONS

Patent Abstracts of Japan, Publication No. 05174684, Publication Date, Jul. 13, 1993, Application Date, Dec. 19, 1991, Application No. 03335390.

International Rectifier Design Tip OT 99–6, "Intelligent Power Switches (IPS): Operation in an Automotive Environment", X.de Frutos and A. Mathur.

National Semiconductor, M9061 Power MOSFET Driver with Lossless Protection, jApr. 1995.

Powerhouse–NP–Series Mar. 2001, NEC Electronics (Europe) GmbH, Aug. 2001, Document No., NP–S–NEWS071V50.

International Rectifier, IRF 490f HEXFET(Registered Trademark) Power MOSFET—Aug. 25, 1997.

Siemens PROFET (Registered Treadmark) Data Sheet BTS550P—Smart Highside High Current Power Switch, May 18, 1999.

* cited by examiner

Primary Examiner—Jonathan Salata (57) ABSTRACT

An electrical system includes a solid state relay (1) and an electrical connector (2) that connects solid state relay (1) to a load (4). The solid state relay (1) includes a power MOSFET (Q1) for switching power to the load (4). A PNP transistor (Q2) monitors the voltage drop across the power MOSFET (Q1), and shuts the power MOSFET off when the voltage drop exceeds a reference level. The solid state relay circuitry floats when the power MOSFET is commanded OFF so there is no leakage to ground. The relay (1) can be used with an electrical connector that includes a short pin (34) or shunt (16) that is disconnected before male and female terminals (12, 22) are unmated. Disconnection of the shunt (16) or the short pin (34) causes the power MOSFET to be commanded OFF so that there is no current flowing through the male and female terminals (12, 22) when they reach an arc susceptible position. The solid state relay (1) and the connector (2) are suitable for use in a 42 Volt automotive electrical system.

12 Claims, 9 Drawing Sheets

SMART SOLID STATE RELAY

BACKGROUND OF THE INVENTION

1. Field of the Invention

This invention is related to a solid state relay including a power MOSFET in which the circuitry of the relay floats when the power MOSFET is commanded OFF to prevent leakage currents from draining a battery. This invention is also related to the prevention of arcing when electrical connectors are unmated. This invention is also related to 42 volt electrical systems that can be used in automobiles or motor vehicles to reduce electrical losses.

2. Description of the Prior Art

Contacts carrying significant amounts of power will arc when disconnected. The amount of arc damage experienced by the contacts depends on their physical structure, the load current, the supply voltage, the speed of separation, the characteristics of the load (resistive, capacitive, inductive) as well as other factors.

Future automotive systems are expected to utilize 42 volts in order to reduce the load currents and the associated wiring losses. This increased voltage could cause significant arc damage to occur to the present connectors designed for 12-volt operation. To avoid the possible liabilities associated with catastrophic connector failure, automotive manufacturers are requesting a new connector design that can be hot-swapped some significant number of times. Twenty cycles is considered to be a minimum requirement.

To disconnect 42-volt power without significant damage requires interrupting about 1500-watts for many loads and as much as 15 KW for the main battery circuit. Present day modules used in automotive applications can consume more than 500 watts. Power supplies must deliver one or more kilowatts of energy. Conventional solutions require either that the current be shut off before the contacts are separated or unmated or employ a sacrificial contact portion. Cost, space, reliability, safety, performance and complexity of these conventional solutions make them unsuitable for applications, such as automotive electrical systems.

There are many things, known in the power utility profession, which will quickly extinguish an arc and many things known in the relay industry that will minimize arc damage to connectors and contacts. These can be found in literature such as *Gaseous Conductors* by James D. Cobine and the *Ney Contact Manual* by Kenneth E. Pitney. Most of these methods are not practical in typical smaller and separable electrical connectors such as those used in automobiles, computers and appliances. None of them will eliminate arcing. In fact, even contacts that are rated for current interruption use in such smaller power connectors will be destroyed by interrupting rated currents often enough or slowly enough. There is a finite life for existing connectors since arcing will occur and cause damage each time the connector is disconnected.

One approach that has been suggested is to include a relay in the electrical system that will be switched off prior to disconnection of an electrical connector. The relay could be incorporated in a junction box or other enclosure that must be opened before the connector can be disconnected. When the junction box or enclosure is opened, the relay would also be opened when this approach is employed. Such an approach would, however, require additional components for every electrical connector that might be unmated or mated under load, and as such would add complexity and cost to an automotive electrical system.

Another alternative that has been considered is to incorporate a switching component, such as a power MOSFET, in an electrical connector. Such a switching device would be switched off before arcing could occur. However, individual power MOSFET's do not possess the required combination of size, current carrying capacity and cost to make such a solution practical at the present time. In addition conventional power MOSFET's have not been widely accepted for use in automotive applications, because of leakage currents that can drain a battery when a large number of such devices are used in an automotive electrical system. U.S. Pat. No. 5,926,354 discloses a solid state relay and a circuit breaker that includes a power MOSFET. However, the solid state relay circuit disclosed therein includes a ground connection through which current can leak from the battery positive terminal to ground when the power MOSFET is commanded to the OFF state. It is believed that conventional solid state relays that employ a power MOSFET exhibit this leakage problem if those relays are used in a standard relay package with a standard pin configuration. A solid state relay in accordance with the instant invention eliminates the leakage problem for solid state relays in standard configurations.

SUMMARY OF THE INVENTION

The instant invention comprises a solid state relay including a power MOSFET in which there is no leakage to ground when the solid state relay is powered, but commanded to the off state, in which current is not carried by the power MOSFET. Furthermore, this solid state relay can be used in conjunction with an electrical connector in which the solid state relay will be turned off between the start of unmating of matable electrical connector halves and complete unmating of the two connector halves.

A solid state relay, according to this invention includes a power MOSFET for switching current to a load. The MOSFET includes a source, a gate and a drain. The power MOSFET is turned on by an active low input to the gate. The solid state relay also includes a circuit for applying a gate input to shut off drain to source current when a voltage drop between the MOSFET source and drain exceeds a reference voltage. The power MOSFET is isolated from ground potential except through the gate when the solid state relay is connected between a positive battery voltage and a load. The circuit and the active low gate are configured to float in the absence of an active low input to the gate, and are not tied to ground, to prevent leakage when the power MOSFET is in a nonconducting state.

In representative embodiments, the solid state relay includes a first relay terminal connectable to a high battery voltage potential, a second relay terminal connectable to the high side of a load, and a third relay terminal comprising a signal input terminal. This solid state relay also includes a power MOSFET having a source connected to the first relay terminal and a drain connected to the second relay terminal. The power MOSFET includes a gate connected to the third relay terminal. The power MOSFET is turned to an On state by an active low input applied to the third relay terminal. A pull up resistor is connected between the first and third relay terminals. A circuit, including a PNP transistor in the preferred embodiment, senses source-drain voltage drop when the power MOSFET is in an ON state. The voltage sensing circuit is connected to the gate so that when the source-drain voltage drop exceeds a reference level, the power MOSFET is turned to an OFF state. The solid state relay circuitry floats relative to ground potential when the active low input is removed from the third terminal so that leakage current between a high battery voltage potential and a ground voltage potential is eliminated when the power MOSFET and the solid state relay are commanded to an OFF state by the absence of an active low input at the third relay terminal. This relay can be used in conjunction with an electrical connector connecting the solid state relay to the load having a long pin to the second relay terminal and a short pin attached to an additional relay terminal.

According to another aspect of this invention, an electrical system, such as a 42 Volt automotive electrical system, includes an electrical connector and a solid state relay attached to the connector to prevent arcing when mating contacts in the electrical connector are disconnected. The electrical connector includes first mating contact means, such as load pins or blades, and second mating contact means, such as a shunt or short pin. The first mating contact means have sufficient current carrying capacity to carry the entire current through the connector. The second mating contact means will be disengaged prior to disconnection of the first mating contact means, when the electrical connector halves forming the electrical connector are unmated. The solid state relay includes a power MOSFET. The power MOSFET is switched off when the second mating contact means are disconnected so that no current is carried by the first mating contact means when the first mating contact means are disconnected.

BRIEF DESCRIPTION OF THE DRAWINGS

FIGS. 7A and 7B are views of male and female terminals in an alternate embodiment of this invention in which a short terminal is disconnected before longer load terminals to allow sufficient time for the smart solid relay to switch off. FIG. 7A shows the connector in which both long and short pins are mated and FIG. 7B shows that the short pin is unmated before the long or load pin.

FIG. 11 is a schematic of another embodiment of a solid state relay in accordance with this invention. The embodiments of both FIGS. 10 and 11 are suitable for use in applications other than the prevention of arcing as an electrical connector is unmated or mated.

DETAILED DESCRIPTION OF THE PREFERRED EMBODIMENTS

The preferred embodiments of the solid state relays in accordance with this invention are intended to substantially conform to conventional standards for electromechanical relays, such as ISO 7588-2 or SAE J1744. Although these specific standards are discussed with reference to the representative embodiments of the invention, it should be understood that the elements of this inventions could be adapted to other standard or custom relay configurations. Some preferred embodiments are therefore suitable for replacement of standard electromechanical relays, without introducing current leakage common to devices employing power MOSFET's as the primary switching devices. Other preferred embodiment can be used in other applications, such as to prevent arcing when an electrical connector is mated or unmated, but these other embodiments still conform in many ways to these standards. For example, the pin configurations for those relays that are used to prevent arcing still basically conform to standard pin configurations so that minimal changes to other components of wiring systems need be made. For this reason the standard pin designations, 30, 85, 86, 87 and 87a are used for each embodiment. The location of these pins are also shown in schematics of the relay circuits. Each of the embodiments of solid state relay has been identified as solid state relay 1, even though various embodiment may differ in detail. Certain embodiments of this relay include components that could be added as separate components to circuits in which those embodiments might be employed.

Figure 1:
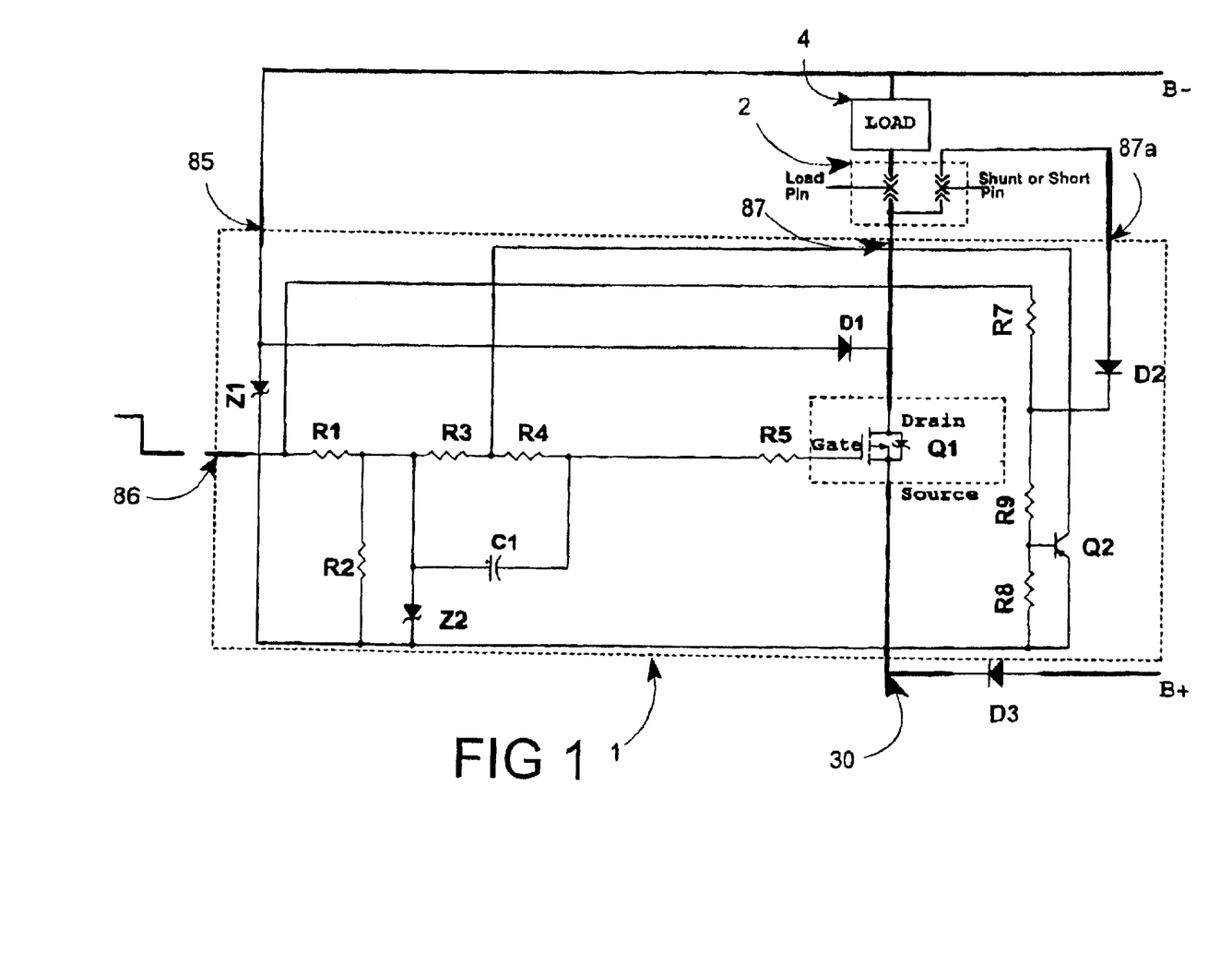
FIG. 1 is a schematic of a circuit in which a power MOSFET is used in a solid state relay that can be switched off before arcing could occur as an electrical connector is unmated or mated.

The first embodiment of solid state relay 1 shown in FIG. 1, is OFF (Q1 not conducting) with its circuitry floating, with respect to ground, until it is commanded ON by an Active Low signal at the input terminal. The circuitry is allowed to float to eliminate leakage current flowing from B+ to ground when the relay 1 is powered but is commanded OFF. Leakage can be a significant problem in automotive applications in which other solid state relays might used to switch conventional loads. Even small leakage currents can significantly drain a battery when a large number of solid state relays are used in an automobile or motor vehicle.

The solid state relay 1 shown in FIG. 1 employs a conventional power MOSFET. In the preferred embodiment, an IRF 4905. MOSFET manufactured by International Rectifier is employed. This particular power MOSFET is relatively simple and relatively inexpensive and does not include some of the additional features of other power MOSFET that are not required for this solid state relay application. The source of this power MOSFET is at a higher potential than the drain when the power MOSFET is OFF. As shown in FIG. 1, the source is connected to the positive battery voltage through an intervening diode D3. The power MOSFET drain is connected through a connector 2 to a load, which is in turn connected to the relatively negative battery voltage. Details of this connector 2 will be subsequently discussed in greater detail. The load depicted in FIG. 1 is representative of any one of a number of conventional loads, including inductive loads, which can be switched with this relay.

The power MOSFET gate is connected to conventional control circuitry that need not be shown or discussed in detail. It is only necessary that this control circuitry be capable of inputting an Active Low signal to the power MOSFET, and in turn the solid state relay, is to be commanded ON. When the solid state relay 1 is commanded ON, the power MOSFET Q1 turns on and begins conducting, thus providing power to the load. When used in a motor vehicle application, the Active Low input signal could be generated as a result of a manual command to energize a particular load, such as lights or a heater fan, or the Active Low input signal could result automatically because of a change in state of some monitored variable.

A bipolar PNP transistor Q2 is also part of circuitry of this solid state relay. The emitter of transistor Q2 is connected to the positive battery voltage through diode D3. The collector of transistor Q2 is connected to the gate of the power MOSFET at the junction of resistors R3, and R4. The base of transistor Q2 is connected to the emitter through a resistor R8. The transistor base is also connected to the relay contact terminal 86 through resistors R9 and R7. The PNP transistor base is also connected to at least one pin or contact in the connector 2 through intervening resistor R9 and diode D2.

The purpose of the PNP transistor Q2 is to monitor or sense the voltage drop across the source and drain of the power MOSFET Q1 and a shunt or short pin in the connector. When the solid state relay 1 commanded ON, with the power MOSFET conducting, the drain/source resistance Rds (on) and the current will result in a voltage drop across source/drain junction of power MOSFET Q1 that is proportional to the current flowing through the power MOSFET Q1. In the preferred embodiment, when the voltage drop across the source/drain junction and the shunt or short pin connection exceeds 0.7 volts DC, the PNP transistor Q2 turns ON, shutting off the MOSFET Q1. When this solid state relay 1 is used with the connector 2, the diode D2 and resistors R8, R9 and R7 provide the capability of biasing the Emitter/Base junction of the PNP transistor to shut off the power MOSFET Q1 at varying current ranges. In the preferred embodiment, the Emitter/Base junction can be biased between 0.1V and 0.6V.

A number of components are included in the solid state relay 1 to protect the relay or other components of the electrical system in which the relay is used. Zener diode Z1 is connected between the positive and negative battery voltages to provide over voltage protection for the battery. For a 14 volt system, a diode Z1 will typically be selected to protect the battery from load dump transients which would exceed a predetermined value, such as 30 volts. For a 42 volt system, a diode Z1 would be selected to protect the battery from 68 volts. Diode D3 is connected at the positive battery voltage to protect circuitry connected to the battery from reverse battery connection. Diode D1 is connected between the negative battery voltage and a point between the load and the drain of power MOSFET Q1. Diode D1 is a free wheeling diode that protects the relay 1 from transients generated by disconnection from inductive loads. The RC circuit of R4 and C1 provides immunity from transients, such as inrush current from lamp loads, prematurely shutting off power MOSFET Q1. Zener diode Z2 limits the gate voltage of the power MOSFET Q1 and provides a constant voltage for operation of PNP transistor Q2. Pull up resistor R2, between the gate drive circuit and positive voltage potential prevents inadvertent triggering of the relay 1.

As shown in FIG. 1, the solid state relay 1 is used in conjunction with a connector 2 in a configuration that will prevent arcing when the electrical connector is disconnected from the load. Although arcing has not been regarded as a problem in many applications, such as 14 Volt automotive electrical systems, a 42 volt electrical system could result in arcing problems, especially when an electrical connector is disconnected under load. At least one load pin in included in the connector for conducting current through the power MOSFET Q1 and the load. The connector 2 also includes a short pin or a shunt. Either the short pin or the shunt would be disconnected prior to disconnection of the load pin. As shown in FIG. 1, either the shunt or the short pin is connected to the drain of the power MOSFET Q1. Since the short pin or shunt is connected indirectly to the base of the transistor Q2, disconnection of the short pin or shunt, or the drain of the power MOSFET Q1, will cause the PNP transistor Q2 to switch ON. Since the transistor Q2 is connected between the positive battery voltage and the gate of the power MOSFET, the gate will be in a high state when the transistor Q2 is ON, conducting current from the positive battery voltage. Since the power MOSFET Q1 is off when the gate is in a high state, the power MOSFET Q1 will revert to the OFF or nonconducting state when the transistor Q2 is ON, and one event that will turn the transistor Q2 On is the disconnection of the short pin or shunt in connector 2. The switching time of this solid state relay 1 is sufficiently fast that a short pin that is approximately 0.200 inches shorter than a load pin will provide adequate time for the relay 1 to switch from an ON to and OFF state before arcing will occur as the longer load pin is disconnected in the connector 2.

Figure 2:
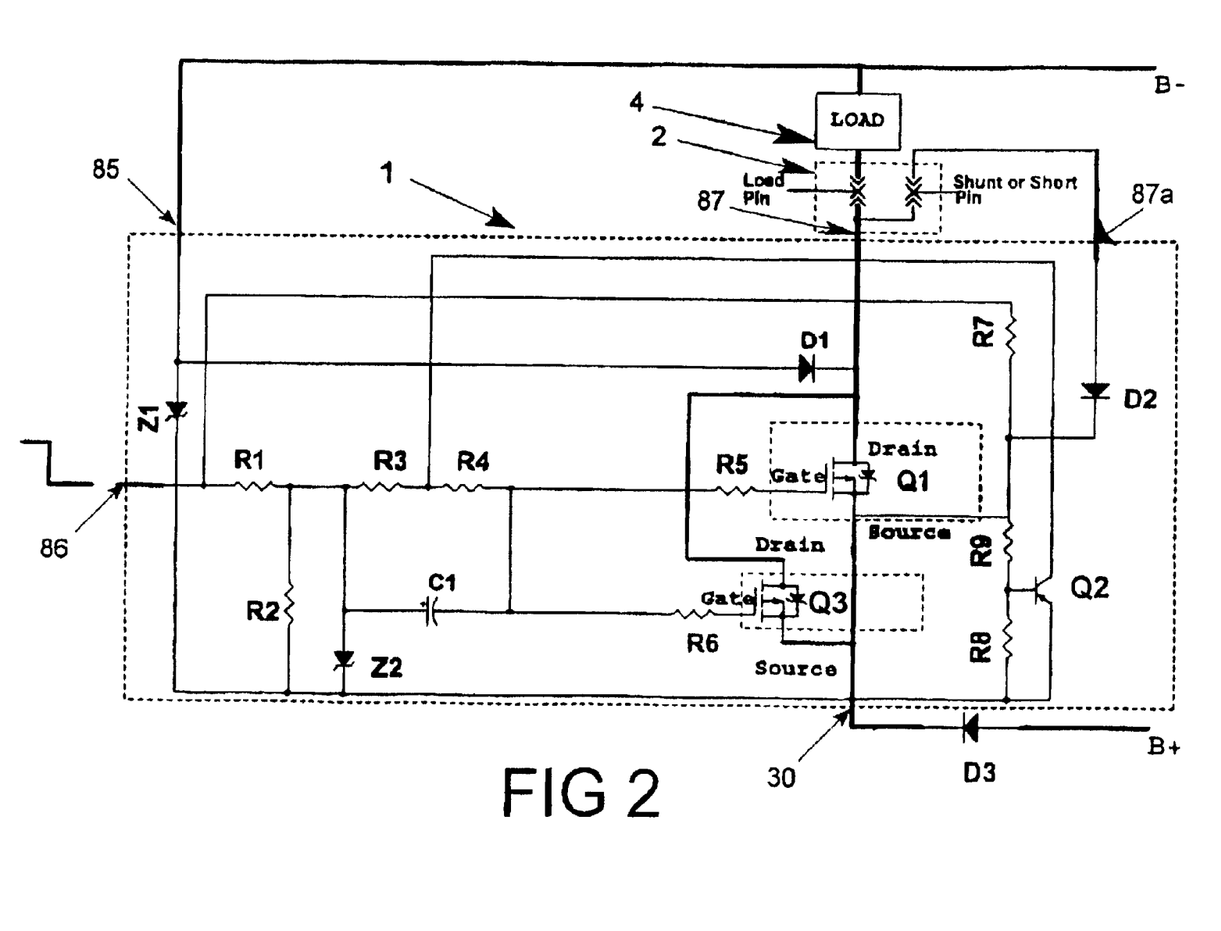
FIG. 2 is a schematic similar to FIG. 1 in which two power MOSFET's are paralleled in the smart solid state relay.

For applications in which a single power MOSFET Q1 is inadequate to carry sufficient current, plural power MOSFET's can be paralleled. FIG. 2 shows a solid state relay 1 in which two power MOSFET's Q1 and Q3 are connected in parallel between the positive battery voltage and the load. Resistor R6, having the same value as Resistor R5, is connected to the gate of power MOSFET Q3 in the same manner as Resistor R5 is connected to the gate of power MOSFET Q1. As can be seen from FIG. 2, the same input will be applied to the two gates of the two power MOSFET's Q1 and Q3. Additional power MOSFET devices can be paralleled in the same manner.

Suitable values for the various components shown in FIGS. 1 and 2 are listed below.

Q1—IRF4905/TO-220
Q2—2N1132
Q3—IRF4905/TO-220
C1—1 F/50V ceramic
Z1—30 V or 68 V Zener Diode depending upon B+
Z2—15 volt Zener Diode
D1—1N4007
D2—BAS70/SOT
D3—19TQ15
R1—3K Ohms
R2—10K Ohms
R3—10K Ohms
R4—10K Ohms
R5—100 Ohms
R6—100 Ohms R7—10K Ohms
R8—1K Ohms (1%)
R9—1K Ohms (1%)

Relevant details of one version the connector 2 are shown in FIGS. 3–6. This connector 2 has two mating connector halves 10, 20, the first of which includes at least male terminal or load pin 12. This male terminal or load pin 12 carries the current between the drain of the power MOSFET Q1 and the load 4, and is terminated to the drain, or to a wire or conductor leading to the drain. A mating female terminal 22 in a second connector half 20 is connected to the load 4, either directly or indirectly by means of an electrical conductor. The first connector half 10 includes a shunt 16, that protrudes beyond the male terminal 12 and the housing 14 of the first connector half 10. The shunt 16 must be connected to relay 1, terminal 87a and will be connected to the base of the PNP transistor Q2, through diode D2 and resistor R9, when this first connector half 10 is fully mated with the second connector half 20.

Figure 3:
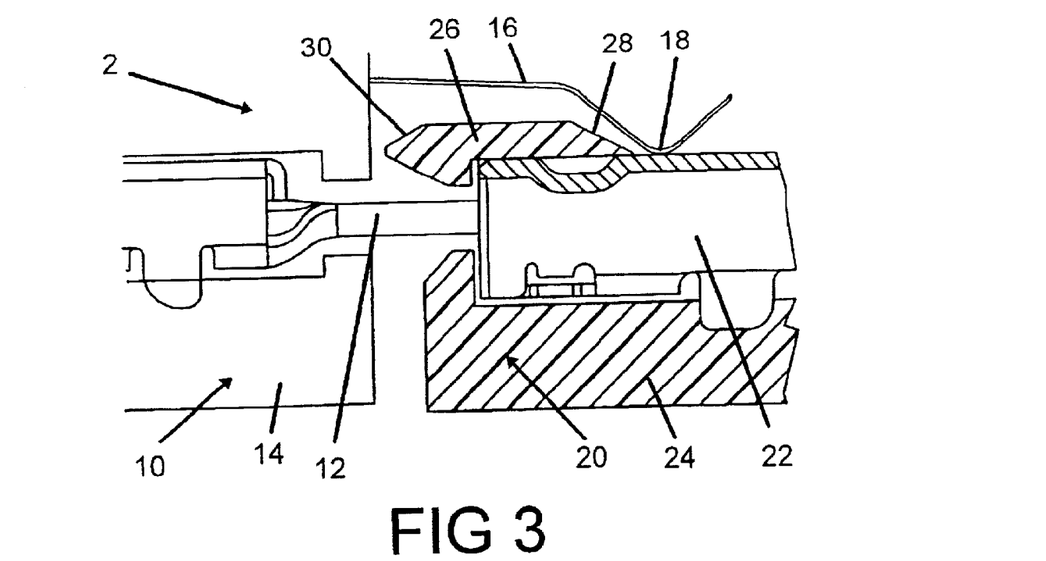
FIG. 3 is a view showing the relative position of electrical contacts in an electrical connector in a fully mated configuration.
Figure 4:
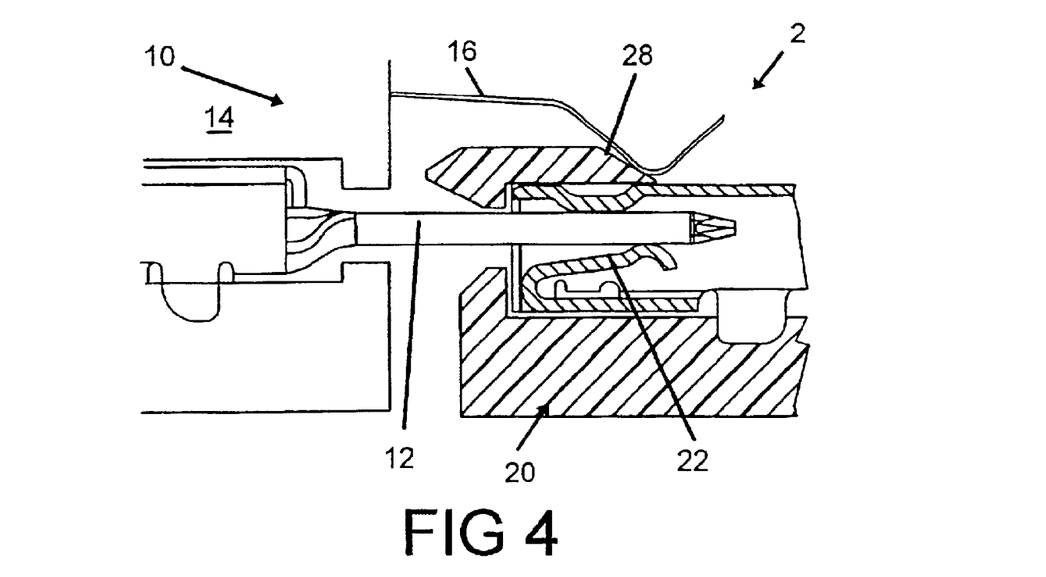
FIG. 4 is a view of the connector of FIG. 3 during initial unmating of connector halves, showing the manner in which a shunt is disengaged before terminals carrying the electrical load are disconnected.
Figure 5:
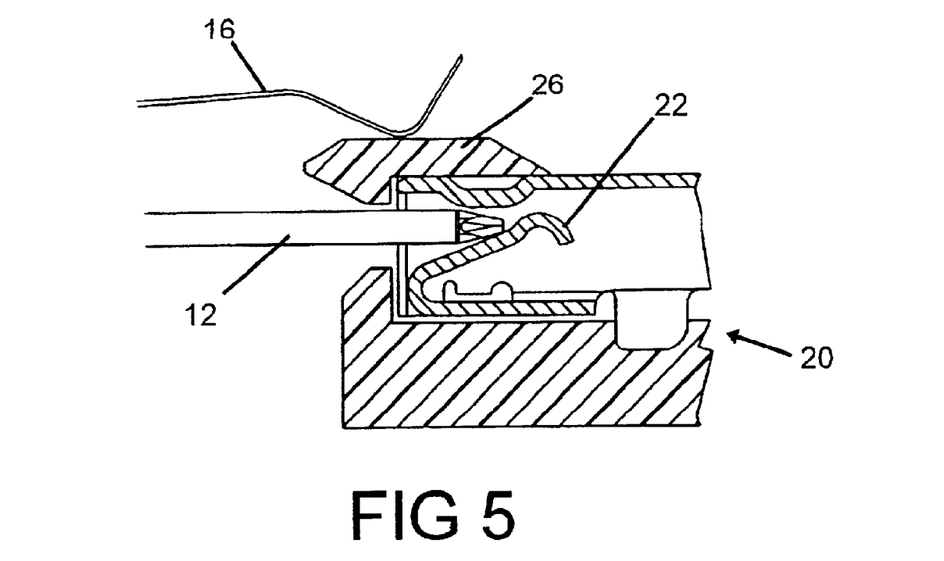
FIG. 5 is a view of the connector configuration of FIGS. 3 and 4, in which male and female load carrying terminals are in a position where arcing might occur if the relay had not previously opened this circuit as a result of disconnection of the shunt.
Figure 6:
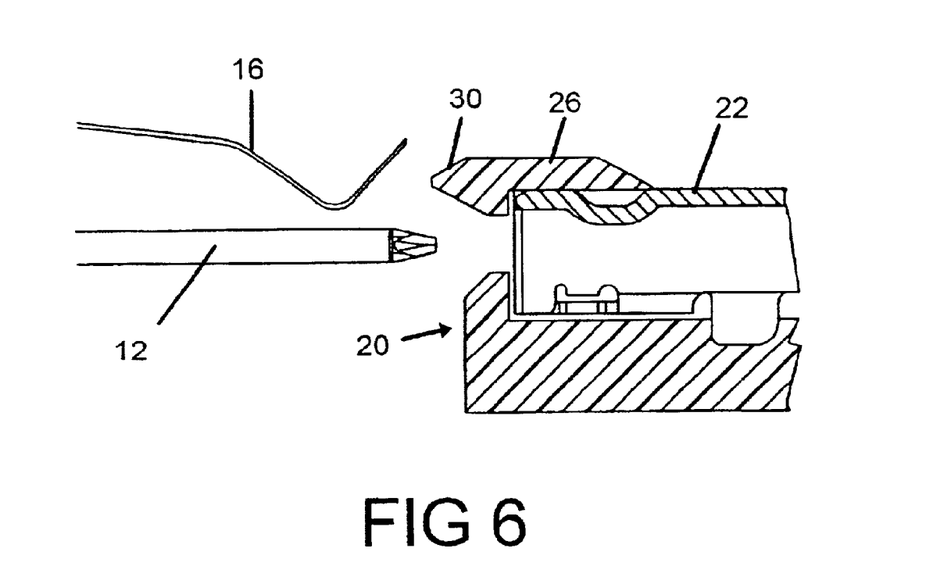
FIG. 6 is a view showing male and female terminal unmated, but with the shunt engaging the disengaged male terminal.

The shunt 16 comprises a deflectable cantilever spring that will also engage the female terminal 22 in the second connector half at a contact point 18 when the two connector halves 10, 20 are fully mated as shown in FIG. 3. When the shunt 16 is connected to the female terminal 22, the shunt 16 will also be connected to the male terminal 12, and subsequentially to the drain of power MOSFET Q1. The housing 24 of the second connector half includes a protruding section 26 with a ramping surface 28 that is opposed to the cantilever beam section of the shunt 16. As the second connector half 20 is unmated from the first connector half 10, a portion of the shunt 16 adjacent the contact point 18 will engage this ramping surface 28. Continued movement of the two connector halves 10, 20, as shown in FIGS. 4 and 5, will disconnect the shunt 16 from the female terminal 22. Since the shunt 16 is not otherwise connected to the male terminal 12, the shunt 16 will be disconnected from the power MOSFET drain when the shunt 16 is deflected outwardly. The shunt 16 will be disengaged from mating engagement with the female terminal 22 before the male terminal 12 is disengaged from the female terminal 22. More importantly, the shunt 16 will be disengaged from the female terminal 22 before the male and female terminals have reached a position, as shown in FIG. 6, in which arcing could occur if the current were still flowing through the power MOSFET Q1. However, when the shunt 16 is first disconnected from the female terminal 22, as shown in FIG. 4, the connection between the drain of the power MOSFET Q1 and the base of the PNP transistor Q2 is disrupted. The transistor Q2 will then turn ON turning the power MOSFET Q1 off. The combined switching times of the transistor Q2 and the power MOSFET Q1 is less than the time interval between disengagement of the shunt from the female terminal and relative movement of the male terminal to a point, shown in FIG. 5, at which arcing can first occur as the two connector halves are unmated. FIG. 6 shows that when the two connector halves are fully unmated, the shunt 16 will not be connected to the load pin 12. When the two connectors are mated, a current path between the shunt 16 and the load pin 12 will only be established when the connector halves have reached the position shown in FIG. 3, at which point the power MOSFET can be switched to the ON state and current will flow through load pin 12. The MOSFET (relay 1) cannot be switched to the ON state unless shunt 16 is engaged at contact point 18 as shown in FIG. 3. Current will flow only after the male and female terminals have passed the arc susceptible region shown in FIG. 5.

Figure 7A:
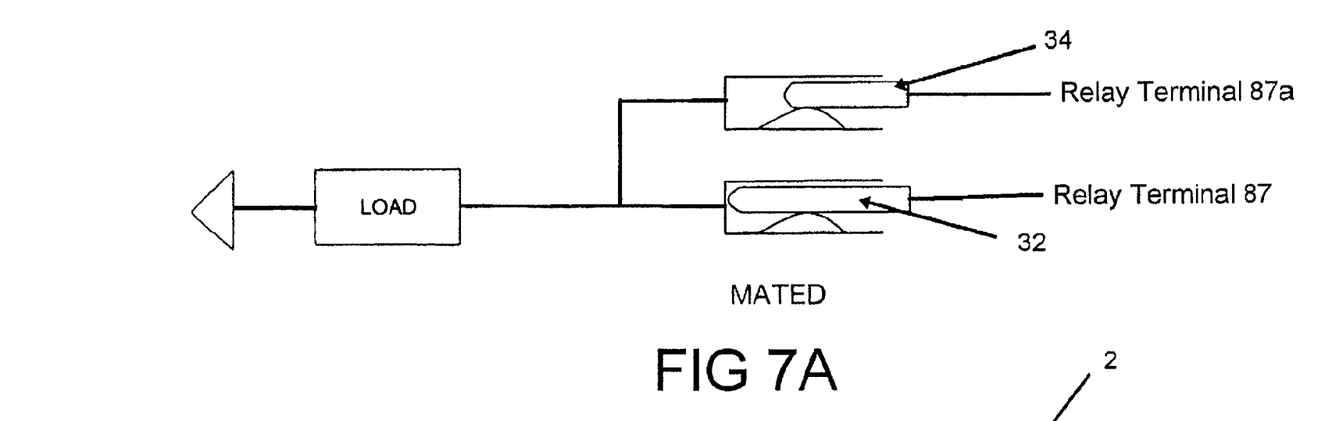
Figure 7B:
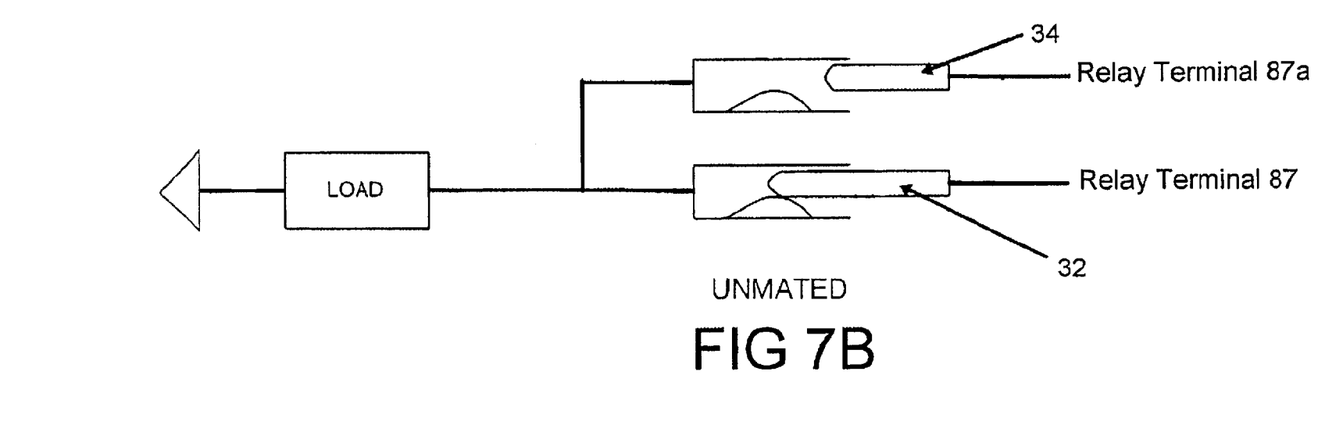

An alternative connector configuration that can be used with this solid state relay 1 is illustrated by the mating terminals shown in FIGS. 7A and 7B. This configuration employs two male terminals which can be in the form of blades or pins or other conventional configurations. A longer load pin 32 is connected to relay terminal 87. A shorter pin 34 is connected to the relay terminal 87a. When both the pins 32 and 34 are connected to a mating female terminal, the relay terminal 87a is connected to the relay terminal 87. The load male terminal or terminals 32 is longer than the separate short male terminal 34 that is connected through diode D2 to the base of the monitoring transistor Q2. If the length of the long or load terminal exceeds the length of the short terminal by approximately 0.200 inch, there will be a sufficient interval between disconnection of the short terminal 34 from the female or receptacle terminal and disconnection of the longer load terminal 32 or terminals to permit the transistor Q2 to switch ON and the power MOSFET Q1 to switch to the OFF state before the load pin 32 reaches a position in which arcing might occur. Thus, the longer load pin 32 will not be carrying current when it reaches an arcing position. The terminals shown in FIG. 7 are only representative of the configurations that could be employed with this arc prevention apparatus.

Figure 8:
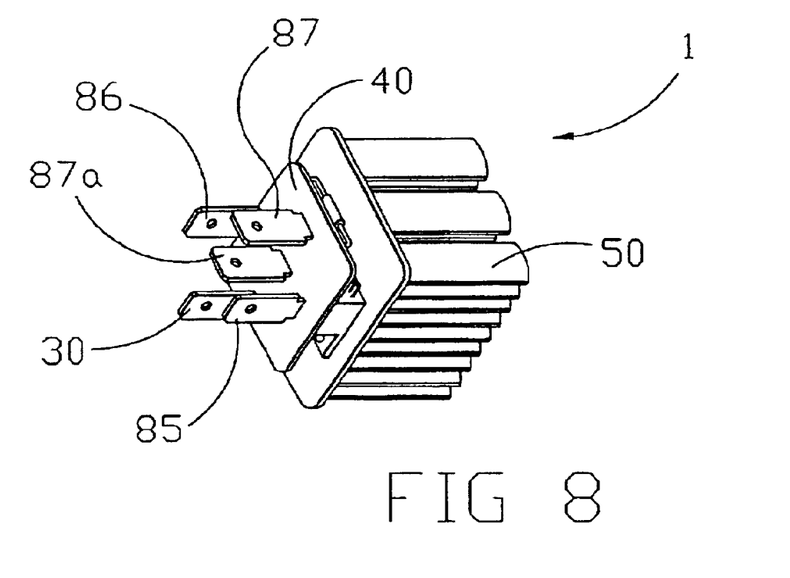
FIG. 8 is a view showing one version of the solid state relay in accordance with this invention. This embodiment of the relay uses quick connect terminals of the type conforming to ISO 7588-2.
Figure 9:
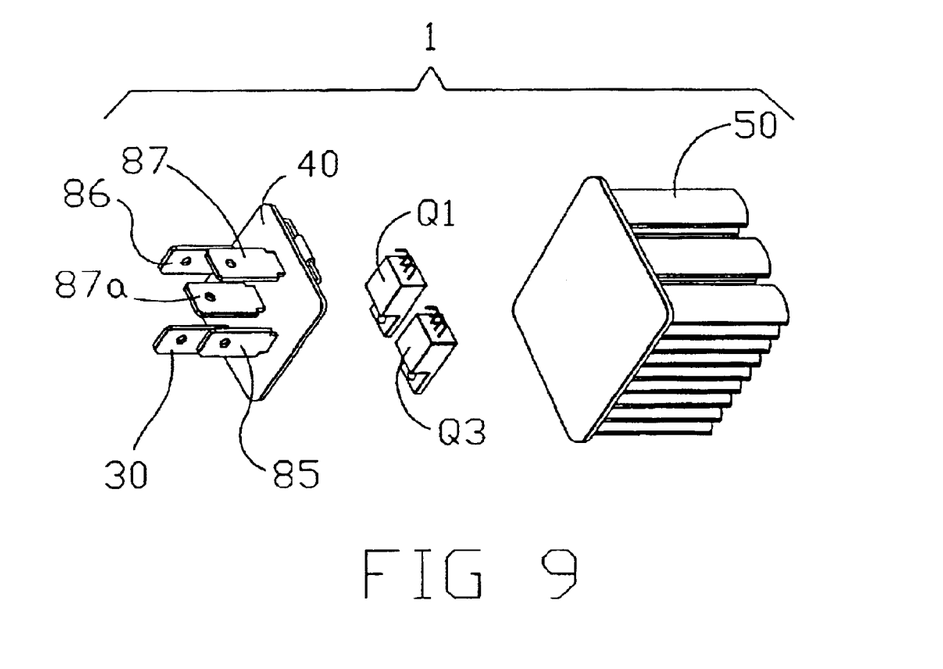
FIG. 9 is an exploded view of the solid state relay, also shown in FIG. 8, showing two power MOSFET's used in this relay.

FIGS. 8 and 9 show a relay apparatus incorporating the elements of this invention in a standard relay configuration. Relay 1 includes pins 30, 85, 86, 87, and 87a in a standard pin configuration conforming to ISO 7588-2. Other standard pin configurations are also possible. Relay 1 also includes a printed circuit board 40 on which the other circuit components can be mounted. This configuration also provides the capability of biasing the Emitter/Base junction of the PNP transistor Q2 between 0.1V and 0.6V. by replacing resistor R9 with a resistor of an appropriate value. As shown in FIG. 9, this relay includes two power MOSFET's Q1 and Q3, so this embodiment will conform to the circuit shown in FIG. 2. It should be understood that only a single power MOSFET can be employed in a solid state relay of this type or additional power MOSFET's can be paralleled. The power MOSFET's Q1 and Q3 are bonded to a conventional heat sink 50, and the assembled package shown in FIG. 8 can be epoxied or inserted into an outer cover, not shown.

Figure 10:
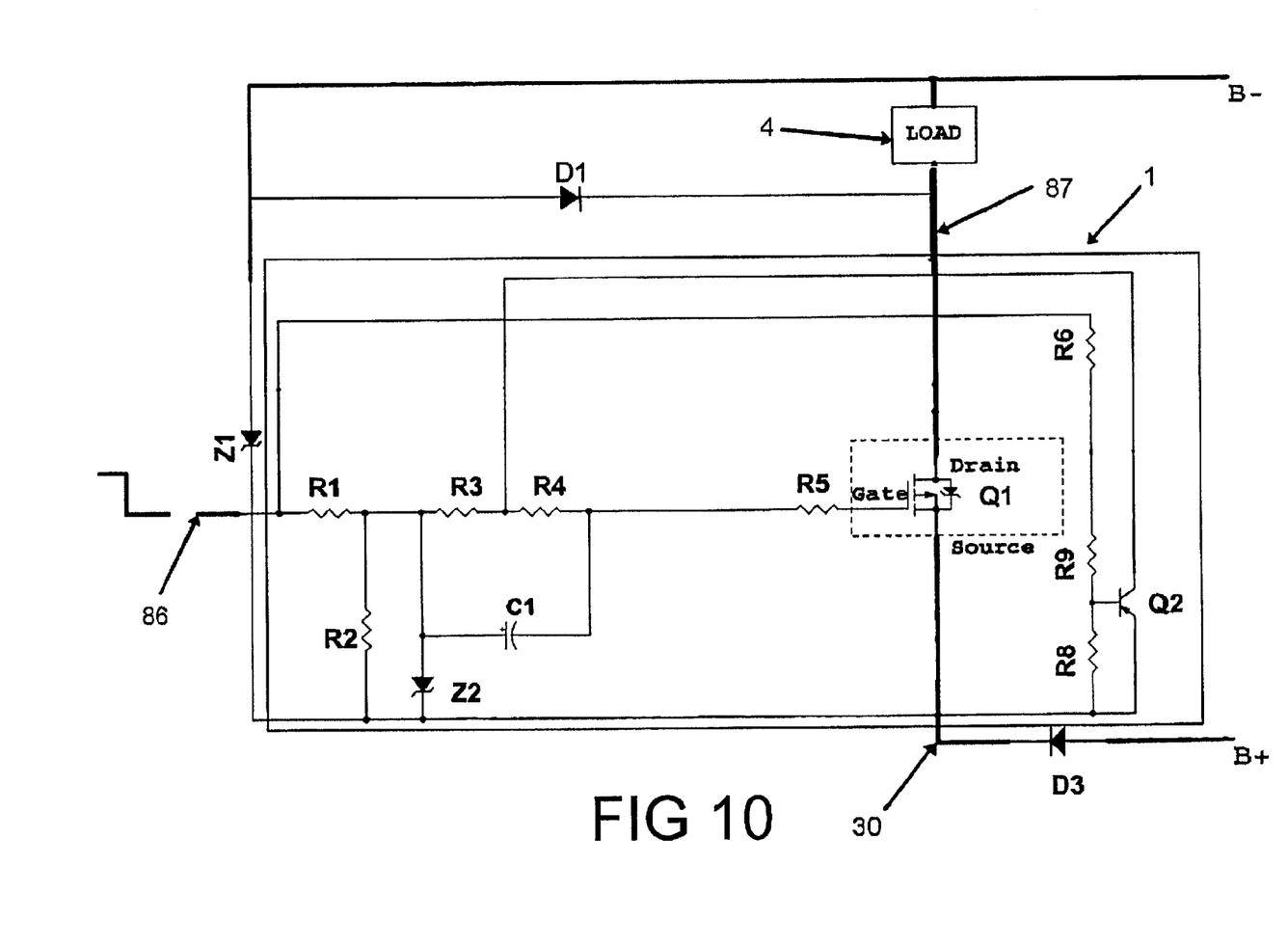
FIG. 10 is a schematic of an embodiment of a solid state relay in accordance with this invention that can be substituted for a conventional electromechanical relay.
Figure 11:
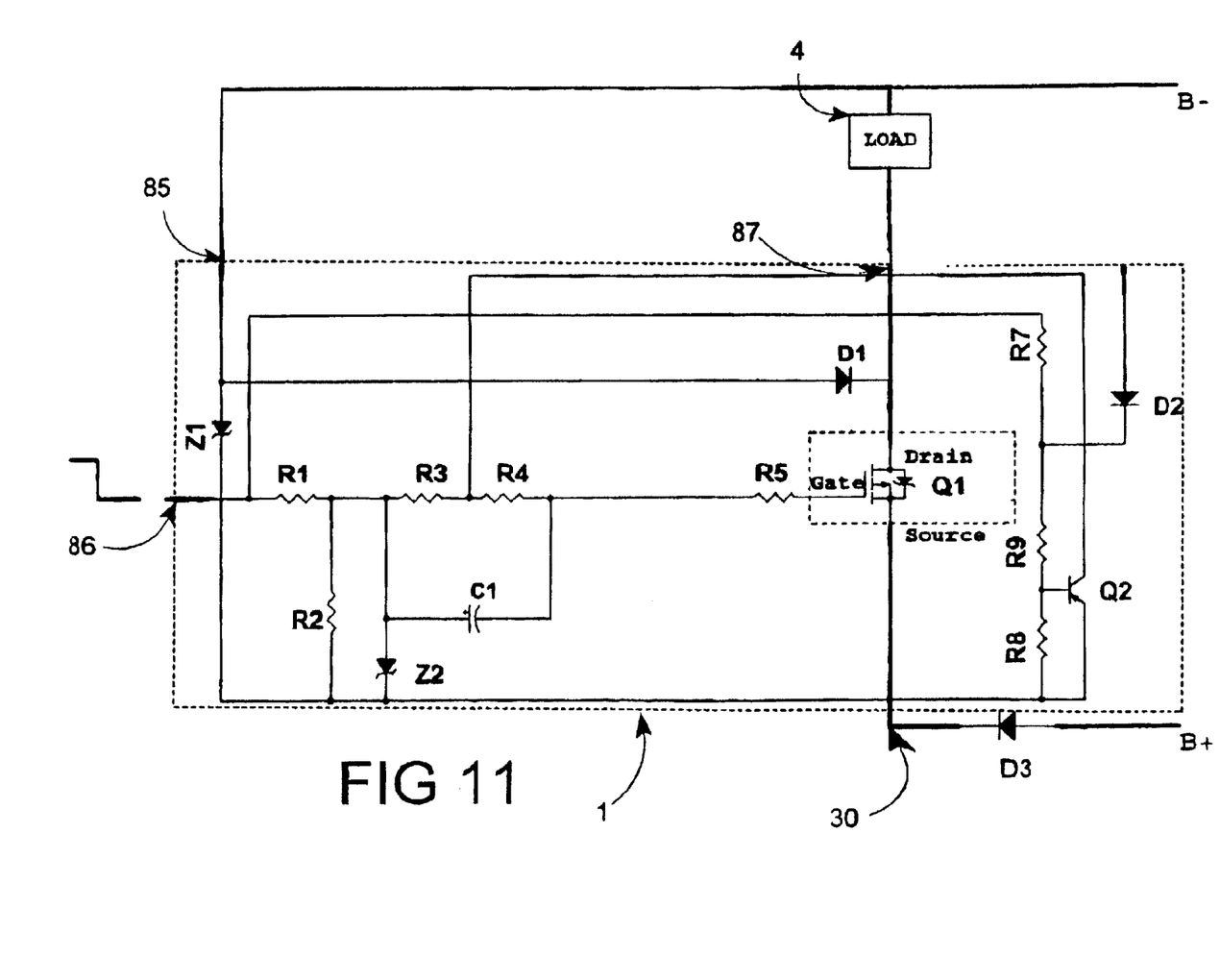

FIGS. 1–7 demonstrate the use of a solid state relay in accordance with this invention in which the relay is used to prevent arcing when an electrical connector is mated or unmated. Solid state relays used to prevent arcing can be assembled as shown in FIGS. 8 and 9. Solid state relays of this type can also be used for other applications. For example, the solid state relay, shown in the schematic of FIG. 10, can be substituted for a conventional electromechanical relay having the same rating. Pin 30 would be connected to the positive potential, pin 87 would be connected to the load and pin 86 would be connected to a disconnectable ground, such as an external switch. A standard electromechanical relay used in the same circuit would have the same electrical connections. The battery overvoltage protection provided by Zener Diode Z1 and the protection of the relay from transients provided by free wheeling diode D1 could be provided elsewhere in the circuit in which the relay is used. FIG. 11 shows a version of a solid state relay in which the Zener Diode Z1 and the freewheeling diode D1 are incorporated in the relay in much the same manner as the schematics of FIGS. 1 and 2. The embodiment of FIG. 11 would, however, require a ground connection 85 that would not normally be available for standard electromechanical relays of this type.

Figures 12, 13:
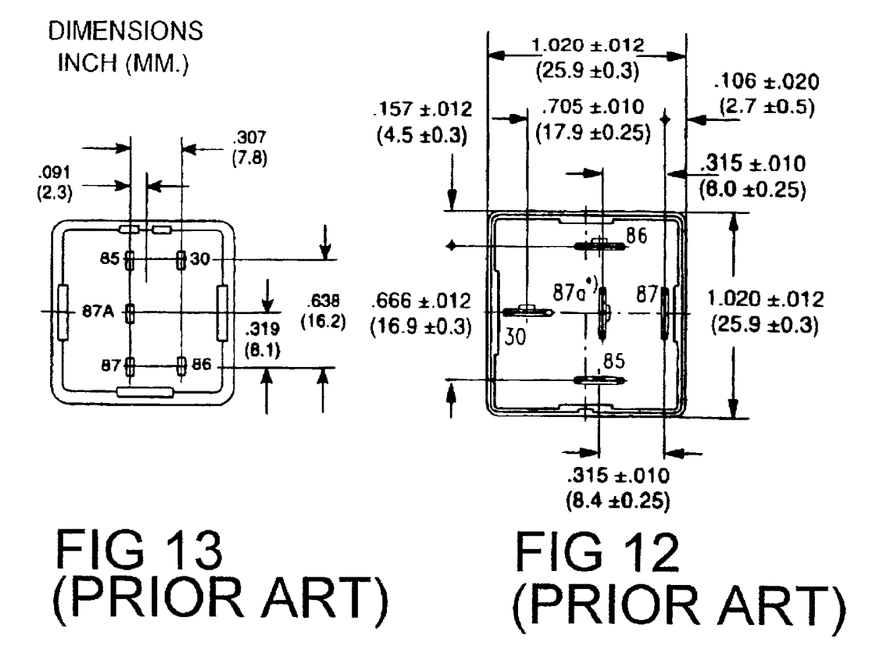
FIG. 12 is a view of a pin configuration for a standard mini relay that conforms to ISO 7588-2.
FIG. 13 is a view of a pin configuration for a standard mini relay that conforms to SAE J1744.

The standard pin configuration for an ISO 7588-2 mini relay is shown in FIG. 12. Primary dimensions are shown in inches with equivalent dimensions in mm. also shown in the view. Each of the versions of the solid state relay 1 depicted herein can be implemented with the pin configuration shown in FIG. 12. These versions of the solid state relay 1 can also be implement in the pin configuration for a standard mini SAE J1744 relay as shown in FIG. 13. These are the two standard relay configurations used for automotive electrical systems, and the smart solid state relay 1 of this invention is basically compatible with each standard relay.

Figure 14:
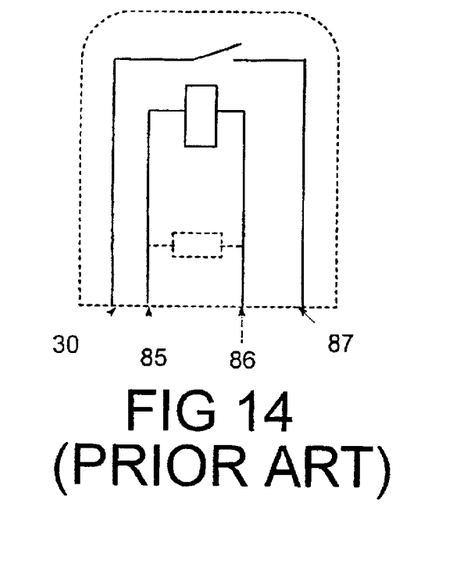
FIG. 14 is a schematic of a standard Form A relay.
Figure 15:
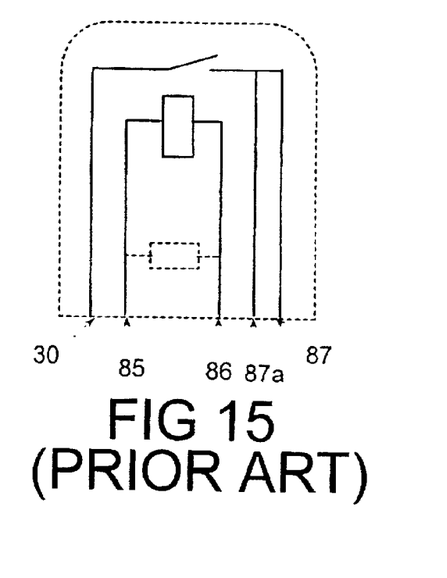
FIG. 15 is a schematic of a standard relay having two switched contacts at the same voltage potential.

FIG. 14 is a simple schematic for a standard Form A relay. A Form A relay has one switchable output, and the smart solid state relay 1 of this invention has the functionality of a standard Form A relay. FIG. 15 is a simple schematic for a relay having a switched output pin 87 and a sense pin 87a. It is this pin configuration with which the smart solid state relay 1 can be used to prevent arching as shown in FIGS. 1–7. The relays of FIGS. 1 and 2 will provide the means to shut off current to the load pins that remain connected to relay output 87 after the short pin or shunt connected to relay sense pin 87a has been disconnected.

An important advantage of this invention is that it can be essentially adapted to standard relay configurations. It should be understood, however, that representative embodiments of this invention, which included this advantage, are not the only versions of this invention that would be apparent to one of ordinary skill in the art. Therefore, this invention is defined by the following claims and is not limited to the representative embodiments depicted herein.

What is claimed is:

1. An electrical assembly for use in an electrical system in which arcing can occur during unmating of two matable parts of an electrical connector connectable between a source and a load, each mating part comprising separable terminals positioned within separable housings, the electrical assembly comprising the electrical connector and a solid state relay, wherein the electrical connector is connected to the solid state relay so that the solid state relay shifts to an open state, disconnecting the source from the load through the relay, after commencement of unmating of the electrical connector, but prior to initiation of arcing between the two parts of the electrical connector.

2. The electrical assembly of claim 1 in which the solid state relay includes a power MOSFET comprising a primary switching member, the power MOSFET switching between ON and OFF states without arcing to which an electromechanical relay would be subject.

3. An electrical system including an electrical connector and a solid state relay attached to the connector to prevent arcing when mating contacts in the electrical connector are disconnected, the electrical system comprising:

the electrical connector including first mating contact means second mating contact means, first contact means in one electrical connector housing being joined to second contact means in the same housing, the first mating contact means having sufficient current carrying capacity to carry the entire current through the connector, the second mating contact means being disconnectable prior to disconnection of the first mating contact means;

the solid state relay including a power MOSFET, the second mating contact means being connected to the solid state relay so that the power MOSFET is switched off when the second mating contact means are disconnected but prior to disconnection of the first mating contact means so that no current is carried by the first mating contact means when the first mating contact means are disconnected.

4. The electrical system of claim 3 wherein the first mating contact means comprises first mating pin and receptacle contacts and the second mating contact means comprises second mating pin and receptacle contacts, the second mating pin contacts being shorter than the first mating pin contacts so that the second mating contact means is disconnected prior to disconnection of the first mating contact means as the electrical connector is unmated.

5. The electrical system of claim 3 wherein the second mating contact means comprises a shunt engaging one contact terminal matable with a second contact terminal to form the first mating contact means, the shunt being disengaged from the one contact terminal before the one contact terminal is unmated from the second contact terminal as the electrical connector is unmated.

6. The electrical system of claim 3 wherein disconnection of the second contact means disconnects the MOSFET drain from a sense circuit to charge up the MOSFET gate voltage to the MOSFET source voltage to turn the MOSFET to an OFF state.

7. The electrical system of claim 3 wherein the solid state relay floats relative to ground when the power MOSFET is off, to eliminate leakage current between a battery and ground.

8. The electrical system of claim 3 wherein the solid state relay is connected between a positive battery terminal and a load.

9. The electrical system of claim 3 wherein current through the power MOSFET is turned on by an active low gate input.

10. The electrical system of claim 9 wherein the relay includes a monitoring circuit connected to monitor the voltage drop between source and drain of the power MOSFET, an increase in the source—drain voltage drop, above a reference voltage, resulting in a high signal at the gate to turn the power MOSFET off.

11. The electrical system of claim 3 wherein the second contact means is at a voltage substantially equal to a voltage at the drain of the power MOSFET, when the second contact means are in a mated configuration.

12. The electrical system of claim 3 including multiple parallel power MOSFET's.

* * * * *